(12) United States Patent
DeJarld et al.

(10) Patent No.: US 11,581,448 B2
(45) Date of Patent: Feb. 14, 2023

(54) PHOTOCONDUCTIVE SEMICONDUCTOR SWITCH LATERALLY FABRICATED ALONGSIDE GAN ON SI FIELD EFFECT TRANSISTORS

(71) Applicant: Raytheon Company, Waltham, MA (US)

(72) Inventors: Matthew DeJarld, Wakefield, MA (US); Jeffrey R. LaRoche, Lowell, MA (US); Clay T. Long, Medford, MA (US); Lovelace Soirez, Andover, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/220,660

(22) Filed: Apr. 1, 2021

(65) Prior Publication Data

US 2022/0320360 A1 Oct. 6, 2022

(51) Int. Cl.
*H01L 31/103* (2006.01)
*H01L 31/02* (2006.01)
*H01L 31/0304* (2006.01)
*H01L 31/09* (2006.01)

(52) U.S. Cl.
CPC .... *H01L 31/1035* (2013.01); *H01L 31/02019* (2013.01)

(58) Field of Classification Search
CPC ........... H01L 31/1035; H01L 31/02019; H01L 21/02378; H01L 29/1608; H01L 29/4604
USPC ........................................................ 257/431
See application file for complete search history.

(56) References Cited

U.S. PATENT DOCUMENTS

| | | | |
|---|---|---|---|
| 5,574,464 | A | 11/1996 | Madonna et al. |
| 7,173,295 | B1 | 2/2007 | Mar et al. |
| 7,834,456 | B2 | 11/2010 | Tabatabaie et al. |
| 7,893,541 | B2 | 2/2011 | Caporaso et al. |
| 7,994,550 | B2 | 8/2011 | Kaper et al. |
| 8,154,432 | B2 | 4/2012 | Kaper et al. |
| 8,212,294 | B2 | 7/2012 | Hoke et al. |
| 8,258,632 | B1 | 9/2012 | Sullivan et al. |
| 8,466,555 | B2 | 6/2013 | Chelakara et al. |

(Continued)

FOREIGN PATENT DOCUMENTS

| | | |
|---|---|---|
| CN | 105826406 A | 8/2016 |
| EP | 0235029 A1 | 9/1987 |

(Continued)

OTHER PUBLICATIONS

Koehler, Andrew D., et al. "High voltage GaN lateral photoconductive semiconductor switches." ECS Journal of Solid State Science and Technology 6.11 (2017): S3099.

(Continued)

*Primary Examiner* — Calvin Y Choi
(74) *Attorney, Agent, or Firm* — Bachman & LaPointe, P.C.

(57) ABSTRACT

An integrated circuit structure comprising a substrate having an upper surface; a gallium nitride layer disposed on the upper surface of the substrate; and a photoconductive semiconductor switch laterally disposed alongside a transistor on the gallium nitride layer integrated into the integrated circuit structure wherein a regrown gallium nitride material is disposed on the photoconductive semiconductor switch and operatively coupled with the wafer.

14 Claims, 2 Drawing Sheets

(56) References Cited

U.S. PATENT DOCUMENTS

| | | |
|---|---|---|
| 8,563,957 B2 | 10/2013 | Caporaso |
| 8,575,666 B2 | 11/2013 | LaRoche et al. |
| 8,665,013 B2 | 3/2014 | Saunders |
| 8,823,146 B1 | 9/2014 | Hoke |
| 8,853,745 B2 | 10/2014 | Tabatabaie et al. |
| 9,147,701 B2 | 9/2015 | Saunders |
| 9,154,045 B2 | 10/2015 | Saunders et al. |
| 9,331,153 B2 | 5/2016 | LaRoche |
| 9,356,045 B2 | 5/2016 | Comeau et al. |
| 9,419,125 B1 | 8/2016 | Schultz et al. |
| 9,478,508 B1 | 10/2016 | LaRoche et al. |
| 9,500,773 B2 | 11/2016 | Caporaso |
| 9,543,462 B2 | 1/2017 | Wang et al. |
| 9,761,445 B2 | 9/2017 | LaRoche et al. |
| 10,096,550 B2 | 10/2018 | LaRoche et al. |
| 10,224,285 B2 | 3/2019 | LaRoche et al. |
| 10,447,261 B1 | 10/2019 | Hughes et al. |
| 10,566,428 B2 | 2/2020 | LaRoche |
| 2003/0042404 A1 | 3/2003 | Rice et al. |
| 2003/0102473 A1 | 6/2003 | Chason et al. |
| 2005/0037526 A1* | 2/2005 | Kamiyama ........... C30B 29/406 257/E31.022 |
| 2009/0072240 A1 | 3/2009 | Suh et al. |
| 2010/0019279 A1 | 1/2010 | Chen et al. |
| 2013/0074907 A1 | 3/2013 | Saunders |
| 2015/0131685 A1 | 5/2015 | Schiffrin et al. |
| 2019/0067900 A1* | 2/2019 | Bhattacharya .......... H01S 5/021 |
| 2019/0237554 A1 | 8/2019 | LaRoche et al. |
| 2019/0305157 A1 | 10/2019 | Kub et al. |
| 2020/0083167 A1 | 3/2020 | LaRoche et al. |
| 2020/0091224 A1* | 3/2020 | Bono .................. H01L 33/0093 |
| 2021/0043793 A1* | 2/2021 | Roizin ..................... H05B 3/34 |

FOREIGN PATENT DOCUMENTS

| | | |
|---|---|---|
| EP | 0235029 A1 | 9/1987 |
| JP | 2008153330 A1 | 7/2008 |
| JP | 6271020 B2 | 1/2018 |

OTHER PUBLICATIONS

SR and Written Opinion dated Jun. 24, 2022 issued in International App. PCT/US2022/022523.

"High Voltage GaN Lateral Photoconductive Semiconductor Switches", ECS Journal of Solid State Science and Technology, by Andrew D. Koehler et al., vol. 6, No. 11, Jan. 1, 2017 (Jan. 1, 2017), pp. S3099-S3102.

"Ultrafast characterization of an in-plane gate transistor integrated with photoconductive switches", by K. Ogawa et al., Applied Physics Letters, American Institute of Physics, 2 Huntington Quadrangle, Melville, NY 11747, vol. 66, No. 10, Mar. 6, 1995 (Mar. 6, 1995), pp. 1228-1230.

"On the Dynamic Performance of Laterally Gated Transistors", by Mohammad Samizadeh Nikoo et al., IEEE Electron Device Letters, IEEE, USA, vol. 40, No. 7, Jul. 1, 2019 (Jul. 1, 2019), pp. 1171-1174.

ISR and Written Opinion dated Jun. 23, 2022 issued in International App. PCT/US2022/022521.

* cited by examiner

PHOTOCONDUCTIVE SEMICONDUCTOR SWITCH LATERALLY FABRICATED ALONGSIDE GAN ON SI FIELD EFFECT TRANSISTORS

BACKGROUND

The present disclosure is directed to the improved gallium nitride (GaN) integrated circuit technology, particularly, a structure that includes both GaN photoconductive semiconductor switch (PCSS) and/or photoconductively switched transistor and GaN transistors and accompanying integrated circuit structures.

Currently on-chip GaN on Si High Electron Mobility Transistor (HEMT) switches and RF devices are controlled through electrical signals and are limited by the constraints of traditional semiconductor device design, and fabrication. For example, switching speed is limited to device geometry, and the on-off current ratio. Another example includes the breakdown voltage of the device, which is the maximum voltage the device can handle before catastrophic device failure. This voltage is determined by the breakdown of the HEMT semiconductor material and/or dielectric when electric field peak at the drain side, which is a function of the applied drain bias and gate to drain distance, exceed the breakdown fields of the materials. The maximum operating voltage of current state of the art GaN HEMT switches, operating is a safe operating region below the breakdown voltage, is approximately 650 V. Photoconductive Semiconductor Switches (PCSS) and photoconductively switched transistors are different devices that offer high voltage switching capabilities, ultra-fast switching speeds, or rapid energy pulses that are switched by light instead of by biases applied by metal gates. As such, they offer the potential for increased operating voltages relative to traditional GaN HEMI switches and RF devices.

Further, existing GaN PCSS structures are stand-alone devices, fabricated through nonplanar liftoff based processing, that are connected with transistors, integrated circuits (ICs), and light sources (e.g. lasers and light emitting diodes), as part of a larger module, either through wire bonding or circuit board design.

What is needed for maximum performance and functional density is compact integration photoconductive semiconductor switches and photoconductively switched transistors.

SUMMARY

In accordance with the present disclosure, there is provided an integrated circuit structure comprising a substrate having an upper surface; a gallium nitride layer disposed on the upper surface of the substrate, wherein the substrate and the gallium nitride layer comprise a wafer; and a photoconductive semiconductor switch laterally disposed alongside a transistor on the gallium nitride layer integrated into the integrated circuit structure; wherein a regrown gallium nitride material is disposed on the photoconductive semiconductor switch and operatively coupled with the wafer.

A further embodiment of any of the foregoing embodiments may additionally and/or alternatively include the substrate comprises at least one of a silicon material and a silicon carbide material.

A further embodiment of any of the foregoing embodiments may additionally and/or alternatively include the transistor comprises a field-effect transistor.

A further embodiment of any of the foregoing embodiments may additionally and/or alternatively include the photoconductive semiconductor switch comprises a first electrical contact and a second electrical contact disposed on the GaN layer.

A further embodiment of any of the foregoing embodiments may additionally and/or alternatively include the photoconductive semiconductor switch comprises an aluminum gallium nitride layer disposed on a gallium nitride on silicon wafer; the first electrical contact and second electrical contact are laterally arranged off-mesa on the gallium nitride layer of the wafer, wherein the regrown gallium nitride material is deposited over each of the first electrical contact and the second electrical contact and disposed on the gallium nitride between the first electrical contact and the second electrical contact.

A further embodiment of any of the foregoing embodiments may additionally and/or alternatively include at least one of the regrown gallium nitride material and the gallium nitride layer forms a photoconductive circuit.

A further embodiment of any of the foregoing embodiments may additionally and/or alternatively include the photoconductive semiconductor switch comprises an aluminum gallium nitride layer disposed on a gallium nitride on silicon wafer; the first electrical contact and the second electrical contact are on-mesa being disposed on the aluminum gallium nitride layer, wherein an AlGaN—GaN two dimensional electron gas interface is present; a window etched into the AlGaN layer; and the regrown GaN layer deposited in the window.

A further embodiment of any of the foregoing embodiments may additionally and/or alternatively include the regrown GaN layer is disposed on the exposed gallium nitride layer in the window.

A further embodiment of any of the foregoing embodiments may additionally and/or alternatively include the integrated circuit structure further comprising a transparent silicon dioxide dielectric insulation layer configured to insulate each of the first electrical contact and the second electrical contact of the photoconductive semiconductor switch and the transistor.

A further embodiment of any of the foregoing embodiments may additionally and/or alternatively include the integrated circuit structure further comprising a light source optically coupled to the photoconductive semiconductor switch.

A further embodiment of any of the foregoing embodiments may additionally and/or alternatively include the photoconductive semiconductor switch and the transistor are each configured to be utilized separately or interdependently.

A further embodiment of any of the foregoing embodiments may additionally and/or alternatively include the photoconductive semiconductor switch is homogeneously integrated with the transistor on a gallium nitride on silicon wafer and configured to control the transistor.

A further embodiment of any of the foregoing embodiments may additionally and/or alternatively include the photoconductive semiconductor switch is homogeneously integrated with the transistor in a gallium nitride on silicon wafer and configured to be controlled by the transistor.

A further embodiment of any of the foregoing embodiments may additionally and/or alternatively include a dielectric and an interlayer are transparent to a light source utilized to trigger the photoconductive semiconductor switch.

Other details of the GaN on Si heterogeneous technology are set forth in the following detailed description and the accompanying drawings wherein like reference numerals depict like elements.

DETAILED DESCRIPTION

Figure 1:
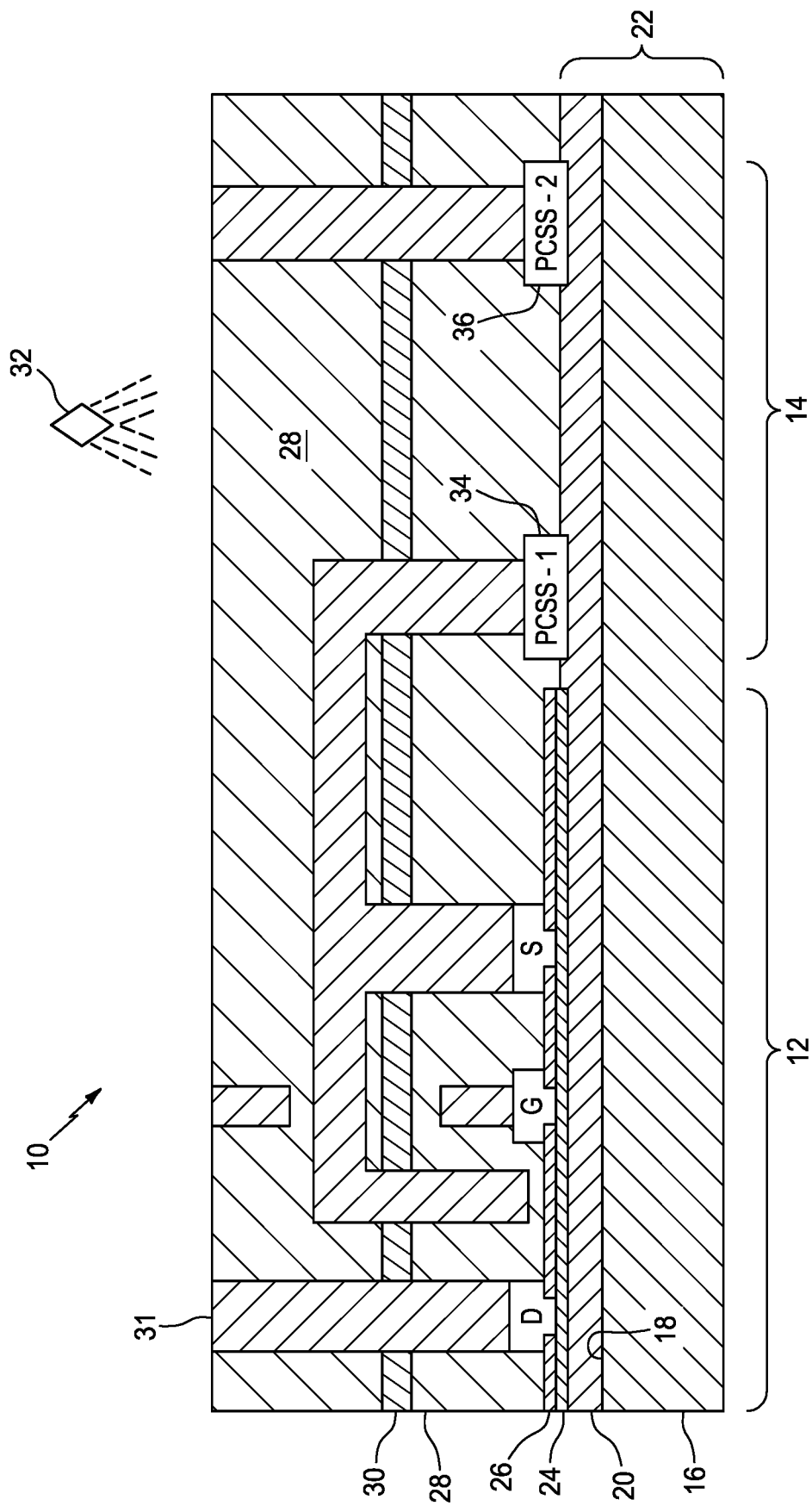
FIG. 1 is a cross-sectional schematic diagram of an exemplary laterally integrated circuit structure.

Referring FIG. 1, there is illustrated a laterally integrated circuit structure 10. The laterally integrated circuit structure 10 includes a transistor 12 electrically coupled with a PCSS 14 each laterally integrated and supported on a common substrate 16. The transistor 12 can be a FET, for example, GaN transistors, Si transistors and accompanying integrated circuit structures. The PCSS 14 can include a GaN PCSS. The substrate 16 can include a silicon (Si) or silicon carbide (SiC) material. The substrate 16 includes an upper surface 18.

A gallium nitride (GaN) layer is disposed on the upper surface 18 of the substrate 16 to form a GaN on Si wafer 22. The GaN layer 20 supports the transistor 12 and the PCSS 14 in tandem such that the transistor 12 and PCSS 14 are laterally integrated and incorporated in the same integrated circuit.

The FET 12 includes an aluminum gallium nitride (Al-GaN) layer 24 disposed on the GaN layer 20. The FET 12 includes silicon nitride dielectric (SiN/dielectric) layer 26 disposed on the AlGaN layer 24 proximate each of the drain D, gate G and source S of the FET 12. A silicon dioxide dielectric ($SiO_2$/dielectric) layer 28 insulates the transistor 12 circuitry as well as an interlayer 30, here for example SiNx, and conductive interconnects 31 disposed within the silicon dioxide dielectric layer 28. The dielectrics 28, 26 and interlayer 30 can be transparent to a light source 32 utilized to trigger the PCSS 14 conduction path. In an exemplary embodiment, in the event of the dielectric or interlayer not being transparent, a window can be opened in the films to allow for light transmission.

The PCSS 14 can include a first electrical contact 34 (PCSS-1) and a second electrical contact 36 (PCSS-2) disposed on the GaN layer. In an exemplary embodiment, the silicon dioxide dielectric layer 28 insulates each of the first electrical contact 34 and second electrical contact 36 of the photoconductive semiconductor switch 14. In exemplary embodiments, the dielectric layer 28 can be silicon nitride, or silicon dioxide material, and the like. In other exemplary embodiments, the first electrical contact 34 and second electrical contact 36 do not have dielectric insulation. A photoconductive semiconductor switch 14 is a region of semiconductor material (such as GaN) that is normally very highly resistive, here for example unintentionally doped or doped with a deep level such as carbon or iron. This allows the material to block a substantial amount of voltage with very low leakage. However, when illuminated with a light source 32 that has an energy above or near the band gap energy, a plethora of excited carriers are generated. These excited carriers now form a low-resistance conduction path used for switching. The PCSS 14 offers high voltage switching capabilities, ultra-fast switching speeds, or rapid energy pulses. An input voltage to the transistor 12 can be controlled by the on-off state of the PCSS 14 or the other way around.

Figure 2:
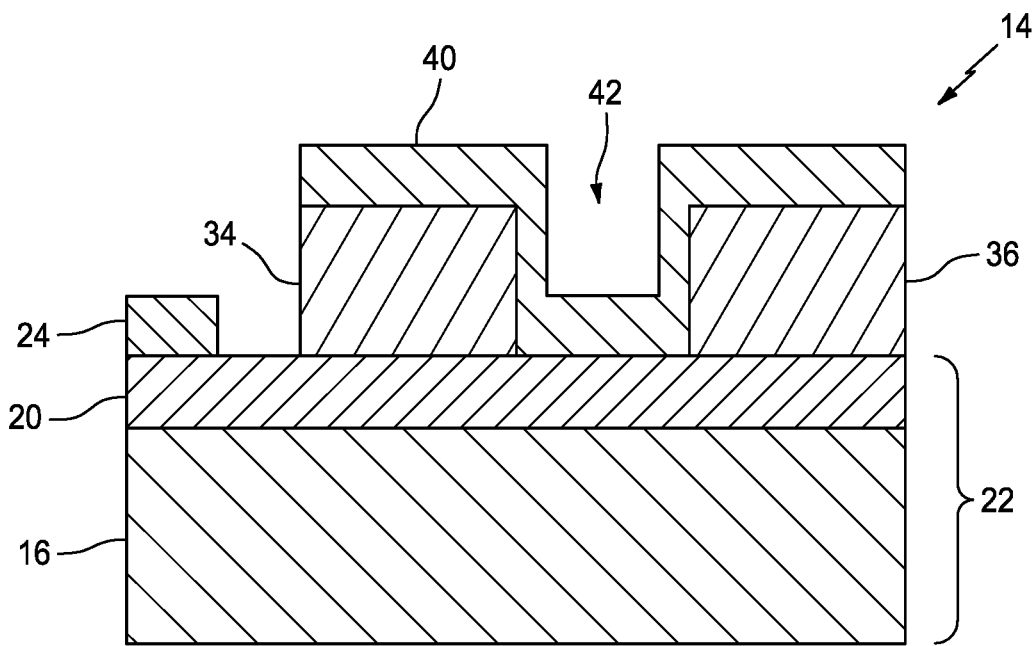
FIG. 2 is a cross-sectional schematic diagram of an exemplary GaN PCSS.
Figure 3:
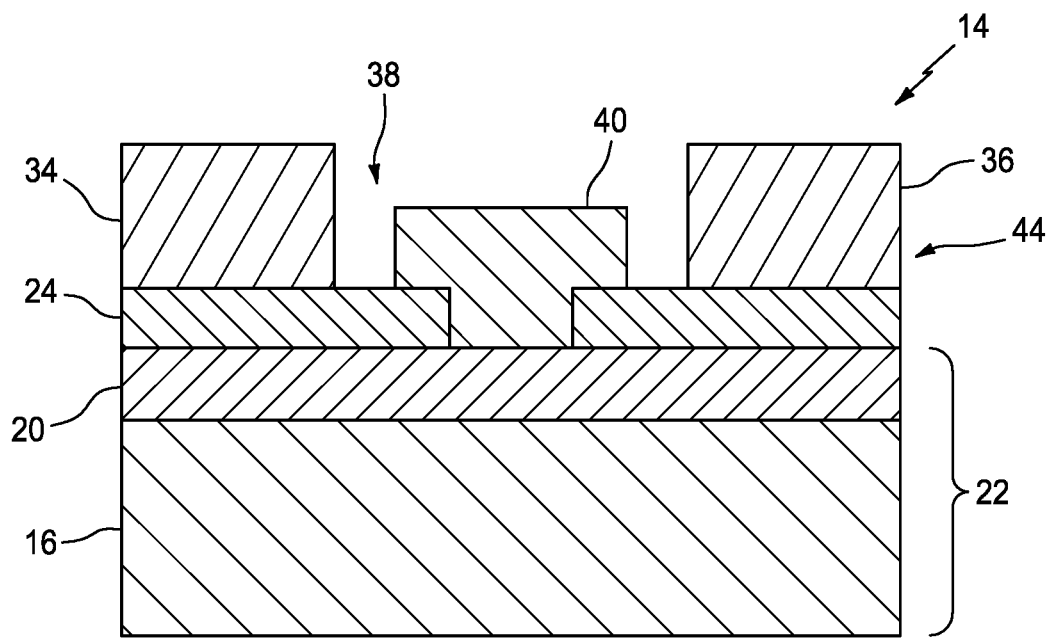
FIG. 3 is a cross-sectional schematic diagram of an exemplary GaN PCSS.

Referring also to FIG. 2, FIG. 3, the GaN PCSS 14 can be fabricated in a variety of ways on the wafer 22.

As shown in FIG. 2, in an exemplary embodiment, the PCSS 14 can include the substrate 16 with the GaN layer 20 disposed on the substrate 16 that comprises the wafer 22. The first electrical contact 34 and second electrical contact 36 are laterally arranged off-mesa on the GaN layer 20 of the wafer 22. A regrown GaN material 40 is deposited over each of the first electrical contact 34 and the second electrical contact 36 and over the gallium nitride layer 20 between the first electrical contact 34 and second electrical contact 36, such that either the regrown GaN 40 and/or the GaN layer 20 forms a photoconductive circuit 42.

As shown in FIG. 3, in an exemplary embodiment, the PCSS 14 can include the substrate 16 with the GaN layer 20 disposed on the substrate 16 that comprises the wafer 22. The first electrical contact 34 and the second electrical contact 36 are on-mesa, being disposed on the AlGaN layer 24, such that the AlGaN—GaN two dimensional interface (2DEG interface) is present. The AlGaN layer 24 can be etched to form a GaN window 38 in the 2DEG layer 24. Regrown GaN 40 can be deposited in the window 38 instead of a gate metal (not shown). The regrown GaN 40 is formed on the exposed GaN layer 20 in the window 38 etched out of the AlGaN layer 24.

The disclosure provides for photoconductive semiconductor switches and photoconductively switched transistors integrated monolithically or through wafer to wafer bonding or die stacking with transistors and light sources. To accomplish this, subtractive planar processing techniques are needed.

A technical advantage of the disclosure includes integration of optically gated switches directly with the GaN on Si process flow to enable intrinsic high voltage capabilities and rapid response times of optically gated switches.

Another technical advantage of the disclosure includes a structure that includes a single chip/wafer that contains both GaN on Si transistor devices and GaN PCSS devices wherein the final device has the functions of GaN transistors, Si transistors, and GaN PCSS, utilized separately or interpedently.

Another technical advantage of the disclosure includes a PCSS device that controls, or is controlled by, a GaN plus Si device homogenously integrated in the same wafer.

Another technical advantage of the disclosure includes a structure that has multiple options for photoconductive materials, such as, an AlGaN/GaN based substrate with regrown AlGaN/GaN either independent or combined; or an AlGaN/GaN 2DEG connected by a narrow region of photosensitive AlGaN/GaN material.

Another technical advantage of the disclosure includes the regrown AlGaN/GaN which can be configured and tuned independently from the epitaxial GaN in the substrate. Configuring and tuning parameters can include geometry/thickness, doping, and concentration/stoichiometry.

Another technical advantage of the disclosure includes methods of fabricating the GaN PCSS can be layer-subtraction based, utilizing techniques traditional to Si foundries.

Another technical advantage of the disclosure includes both GaN PCSS and GaN/Si transistors are fabricated at the same time using the same processing steps.

Another technical advantage of the disclosure includes adding PCSS to a GaN on a Si device which is a nontrivial addition, as it utilizes layers and structure that would not be used in a standalone GaN on Si or standalone PCSS device.

Another technical advantage of the disclosure includes the 2DEG layer must be completely recessed through, unlike in GaN on Si devices.

Another technical advantage of the disclosure includes the substrate of an AlGaN/GaN high electron mobility transistor (HEMPT) epi being used, as opposed to a bulk substrate optimized for photosensitivity, unlike typical PCSS devices.

There has been provided a GaN on Si heterogeneous technology. While the GaN on Si heterogeneous technology has been described in the context of specific embodiments thereof, other unforeseen alternatives, modifications, and variations may become apparent to those skilled in the art having read the foregoing description. Accordingly, it is intended to embrace those alternatives, modifications, and variations which fall within the broad scope of the appended claims.

What is claimed is:

1. An integrated circuit structure comprising:
    a substrate having an upper surface;
    a gallium nitride layer disposed on said upper surface of the substrate, wherein said substrate and said gallium nitride layer comprise a wafer; and
    a photoconductive semiconductor switch laterally disposed alongside a transistor on said gallium nitride layer integrated into the integrated circuit structure; wherein a regrown gallium nitride material is disposed on said photoconductive semiconductor switch and operatively coupled with said wafer.

2. The integrated circuit structure according to claim 1, wherein said substrate comprises at least one of a silicon material and a silicon carbide material.

3. The integrated circuit structure according to claim 1, wherein said transistor comprises a field-effect transistor.

4. The integrated circuit structure according to claim 1, wherein said photoconductive semiconductor switch comprises a first electrical contact and a second electrical contact disposed on the GaN layer.

5. The integrated circuit structure according to claim 4, wherein said photoconductive semiconductor switch comprises an aluminum gallium nitride layer disposed on a gallium nitride on silicon wafer; the first electrical contact and second electrical contact are laterally arranged off-mesa on the gallium nitride layer of the wafer, wherein the regrown gallium nitride material is deposited over each of the first electrical contact and the second electrical contact and disposed on the gallium nitride between the first electrical contact and the second electrical contact.

6. The integrated circuit structure according to claim 5, wherein at least one of the regrown gallium nitride material and the gallium nitride layer forms a photoconductive circuit.

7. The integrated circuit structure according to claim 4, wherein said photoconductive semiconductor switch comprises an aluminum gallium nitride layer disposed on a gallium nitride on silicon wafer; the first electrical contact and the second electrical contact are on-mesa being disposed on the aluminum gallium nitride layer, wherein an AlGaN—GaN two dimensional electron gas interface is present; a window etched into the AlGaN layer; and the regrown GaN layer deposited in the window.

8. The integrated circuit structure according to claim 7, wherein said regrown GaN layer is disposed on the exposed gallium nitride layer in the window.

9. The integrated circuit structure according to claim 1 further comprising:
    a transparent silicon dioxide dielectric insulation layer configured to insulate each of the first electrical contact and the second electrical contact of the photoconductive semiconductor switch and the transistor.

10. The integrated circuit structure according to claim 1 further comprising:
    a light source optically coupled to said photoconductive semiconductor switch.

11. The integrated circuit structure according to claim 1, wherein said photoconductive semiconductor switch and said transistor are each configured to be utilized separately or interdependently.

12. The integrated circuit structure according to claim 1, wherein said photoconductive semiconductor switch is homogeneously integrated with said transistor on a gallium nitride on silicon wafer and configured to control said transistor.

13. The integrated circuit structure according to claim 1, wherein said photoconductive semiconductor switch is homogeneously integrated with said transistor in a gallium nitride on silicon wafer and configured to be controlled by said transistor.

14. The integrated circuit structure according to claim 1, wherein a dielectric and an interlayer are transparent to a light source utilized to trigger the photoconductive semiconductor switch.

* * * * *